US008525630B2

(12) United States Patent
Kobayashi et al.

(10) Patent No.: US 8,525,630 B2
(45) Date of Patent: Sep. 3, 2013

(54) LAMINATED INDUCTOR

(75) Inventors: Tomomi Kobayashi, Takasaki (JP); Hitoshi Matsuura, Takasaki (JP); Takayuki Arai, Takasaki (JP); Masahiro Hachiya, Takasaki (JP); Kenji Otake, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/428,600

(22) Filed: Mar. 23, 2012

(65) Prior Publication Data

US 2013/0038419 A1 Feb. 14, 2013

(30) Foreign Application Priority Data

Aug. 10, 2011 (JP) ................................ 2011-175382
Dec. 26, 2011 (JP) ................................ 2011-284576

(51) Int. Cl.

| | |
|---|---|
| ***H01F 5/00*** | (2006.01) |
| ***H01F 27/28*** | (2006.01) |
| ***H01F 27/24*** | (2006.01) |
| ***H05K 7/00*** | (2006.01) |
| ***H05K 1/18*** | (2006.01) |
| ***H05K 1/03*** | (2006.01) |
| ***H05K 1/16*** | (2006.01) |
| ***H05K 1/11*** | (2006.01) |

(52) U.S. Cl.

USPC ........... 336/200; 336/223; 336/232; 336/233; 336/234; 361/760; 361/761; 361/782; 174/255; 174/260; 174/261

(58) Field of Classification Search

USPC ......... 336/200, 223, 232, 233, 234; 361/760, 361/761, 782; 174/255, 260, 261
See application file for complete search history.

(56) References Cited

U.S. PATENT DOCUMENTS

| | | | | |
|---|---|---|---|---|
| 4,129,444 | A | 12/1978 | Dreyer et al. | |
| 5,522,946 | A | 6/1996 | Tomita et al. | |
| 6,392,525 | B1 | 5/2002 | Kato et al. | |
| 6,459,351 | B1 * | 10/2002 | Maki et al. | 336/200 |
| 6,764,643 | B2 | 7/2004 | Sagawa et al. | |
| 6,784,782 | B2 | 8/2004 | Inoue et al. | |
| 6,814,928 | B2 | 11/2004 | Sagawa et al. | |
| 7,120,993 | B2 * | 10/2006 | Yamamoto et al. | 29/606 |
| 7,446,638 | B2 * | 11/2008 | Nogi | 336/200 |
| 8,018,313 | B2 | 9/2011 | Tada et al. | |
| 2004/0209120 | A1 | 10/2004 | Inoue et al. | |
| 2007/0290161 | A1 | 12/2007 | Tokuoka et al. | |
| 2008/0012679 | A1 * | 1/2008 | Okabe et al. | 336/200 |

(Continued)

FOREIGN PATENT DOCUMENTS

| | | |
|---|---|---|
| JP | H7-123091 B | 12/1995 |
| JP | H09-074011 A | 3/1997 |

(Continued)

*Primary Examiner* — Elvin G Enad
*Assistant Examiner* — Kazi Hossain
(74) *Attorney, Agent, or Firm* — Law Office of Katsuhiro Arai

(57) ABSTRACT

A laminated inductor having a laminate structure constituted by magnetic layers and internal conductive wire-forming layers, wherein the magnetic layer is formed by soft magnetic alloy grains, the internal conductive wire-forming layer has an internal conductive wire and a reverse pattern portion around it, and the reverse pattern portion is formed by soft magnetic alloy grains whose constituent elements are of the same types as those of, and whose average grain size is greater than that of, the soft magnetic alloy grains constituting the magnetic layer.

11 Claims, 3 Drawing Sheets

(56) References Cited

U.S. PATENT DOCUMENTS

| | | | | |
|---|---|---|---|---|
| 2008/0029300 | A1 | 2/2008 | Harada et al. | |
| 2008/0061264 | A1 | 3/2008 | Maeda et al. | |
| 2008/0152897 | A1 | 6/2008 | Maeda et al. | |
| 2008/0231409 | A1 | 9/2008 | Kugai et al. | |
| 2009/0045905 | A1 * | 2/2009 | Nakagawa et al. | 336/232 |
| 2010/0085140 | A1 * | 4/2010 | Tanaka et al. | 336/221 |
| 2010/0253463 | A1 | 10/2010 | Shimomura et al. | |
| 2010/0289609 | A1 * | 11/2010 | Liao et al. | 336/221 |
| 2011/0024670 | A1 | 2/2011 | Otsuki et al. | |
| 2011/0133881 | A1 * | 6/2011 | Nakajima et al. | 336/200 |
| 2011/0267167 | A1 * | 11/2011 | Ogawa et al. | 336/221 |
| 2012/0038449 | A1 | 2/2012 | Ogawa et al. | |

FOREIGN PATENT DOCUMENTS

| | | | |
|---|---|---|---|
| JP | 2000-030925 | A | 1/2000 |
| JP | 2001-011563 | A | 1/2001 |
| JP | 2001-118725 | A | 4/2001 |
| JP | 2002-305108 | A | 10/2002 |
| JP | 2002-313620 | A | 10/2002 |
| JP | 2002-343618 | A | 11/2002 |
| JP | 2007-019134 | A | 1/2007 |
| JP | 2007-027354 | A | 2/2007 |
| JP | 2007-123703 | A | 5/2007 |
| JP | 2007-299871 | A | 11/2007 |
| JP | 2008-028162 | A | 2/2008 |
| JP | 2008-041961 | A | 2/2008 |
| JP | 2008-195986 | A | 8/2008 |
| JP | 2009-088496 | A | 4/2009 |
| JP | 2009-088502 | A | 4/2009 |
| JP | 2011-249774 | A | 12/2011 |
| WO | 2009/128425 | A1 | 10/2009 |
| WO | 2010/013843 | A1 | 2/2010 |

* cited by examiner

LAMINATED INDUCTOR

BACKGROUND

1. Field of the Invention

The present invention relates to a laminated inductor.

2. Description of the Related Art

A method of manufacturing a laminated inductor has been traditionally known, which comprises printing internal conductor patterns on ceramic green sheets containing ferrite, etc., and then stacking the sheets on top of one another and sintering the stacked sheets.

Patent Literature 1 describes a method of manufacturing a laminated chip inductor formed by pressure-bonding and sintering an unsintered ceramic laminate in which a conductor pattern has been formed. According to the manufacturing method disclosed in Patent Literature 1, an auxiliary magnetic material layer is provided at least on magnetic green sheets around the conductor pattern, and the thickness of the auxiliary magnetic material layer after sintering becomes larger than the thickness of the conductor pattern after sintering.

There has been a demand for electrical current amplification for laminated inductors (i.e., offering higher rated currents) in recent years, and to meet this demand, changing the type of magnetic material from ferrite as traditionally used, to soft magnetic alloy, is being considered. Proposed soft magnetic alloys such as Fe—Cr—Si alloy and Fe—Al—Si alloy have a higher saturated magnetic flux density compared to conventional ferrite. On the other hand, these materials have a substantially lower volume resistivity compared to conventional ferrite.

PATENT LITERATURE

[Patent Literature 1] Japanese Examined Patent Application Publication No. Hei 7-123091

SUMMARY

A laminated inductor has two distinctive layers, one being a layer having internal conductive wires resulting from a conductor pattern such as a coil, etc., formed on the green sheet, and the other being a layer constituted by a magnetic body resulting from the green sheet. The former is called "internal conductive wire-forming layer," while the latter is called "magnetic layer."

With the recent trend of increasingly smaller devices, internal conductive wires in laminated inductors are becoming thinner, which gives rise to a need to consider designs that prevent shorting and breaking of internal conductive wires. On the other hand, designs that can present a high L value of the device as a whole using a magnetic material of as high a magnetic permeability as possible are also desired.

In light of the above, the object of the present invention is to provide a laminated inductor that uses a soft magnetic alloy as a magnetic material to increase the magnetic permeability and thereby present a high L value, while also supporting smaller devices.

As a result of earnest study, the inventors completed the present invention, which is a laminated inductor having a laminate structure constituted by magnetic layers and internal conductive wire-forming layers. According to the present invention, the magnetic layer is formed by soft magnetic alloy grains, while the internal conductive wire-forming layer includes an internal conductive wire and a reverse pattern portion around it. The reverse pattern portion is formed by soft magnetic alloy grains whose constituent elements are of the same types as those of the soft magnetic alloy grains constituting the magnetic layer and whose average grain size is greater than that of the soft magnetic alloy grains constituting the magnetic layer.

Preferably the soft magnetic alloy grains forming the magnetic layer and those forming the reverse pattern portion should both be made of a Fe—Cr—Si soft magnetic alloy.

According to the present invention, where the reverse pattern portion uses soft magnetic alloy grains of a large grain size, the magnetic permeability of the device as a whole improves and the L value of the inductor also improves as a result. The magnetic layer that contacts internal conductive wires over a large area uses soft magnetic alloy grains of a small grain size in order to minimize shorting/breaking of internal conductive wires and thereby support smaller devices. Since the soft magnetic alloy grains used for the reverse pattern portion and soft magnetic alloy grains used for the magnetic layer can each be constituted by a soft magnetic alloy having the same or similar composition, the bonding property of the reverse pattern portion with the magnetic layer improves, which in turn helps improve the strength of the device as a whole.

According to a favorable embodiment of the present invention, use of a Fe—Cr—Si alloy for the soft magnetic alloy allows the reverse pattern portion and magnetic layer to be made denser and consequently the strength of the laminated inductor as a whole improves.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DESCRIPTION OF THE SYMBOLS

Figure 1:
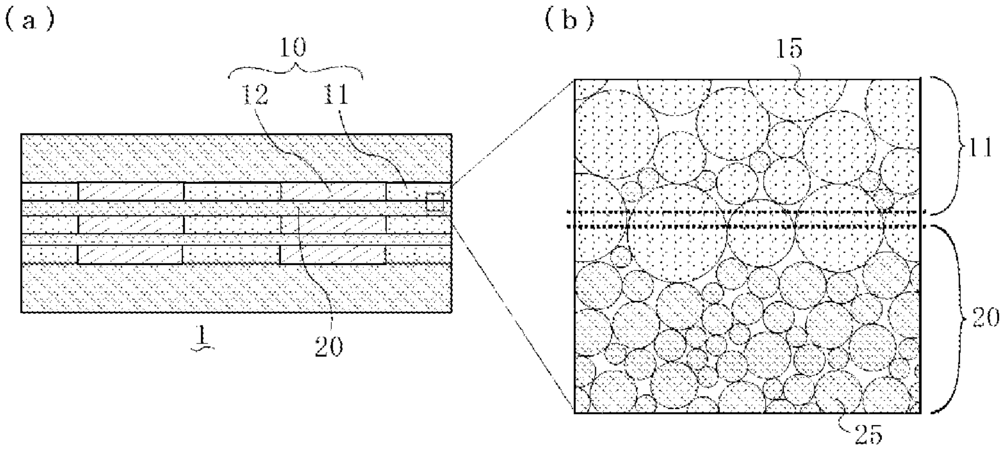
FIG. 1 is a schematic section view of a laminated inductor.

1: Laminated inductor
10: Internal conductive wire forming layer
11: Reverse pattern portion
12: Internal conductive wire
15: Soft magnetic alloy grain
16: Reverse pattern portion precursor
17: Conductor pattern
20: Magnetic layer
25: Soft magnetic alloy grain
26: Green sheet

DETAILED DESCRIPTION

The present invention is described in detail below by referring to the drawings as deemed appropriate. Note, however, that the present invention is not limited to the illustrated embodiment in any way and that, because the drawings may exaggerate the characteristic aspects of the invention, each part of the drawings may not be accurately to scale.

FIG. 1(*a*) is a schematic section view of a laminated inductor. FIG. 1(*b*) is a partially enlarged view of FIG. 1(*a*). According to the present invention, the laminated inductor 1 has a laminate structure. This laminate structure comprises internal conductive wire-forming layers 10 and magnetic layers 20. As for the magnetic layer 20, the entire layer is virtually constituted by soft magnetic alloy grains 25. Typically, the magnetic layer 20 results from a green sheet containing soft magnetic alloy grains 25. The magnetic layer 20 may have through holes formed in it where the holes are filled with a conductor material as explained later, but other than that, it contains virtually no conductive material. The internal conductive wire-forming layer 10 includes an internal conductive wire 12 and a reverse pattern portion 11 around it. Typically, the internal conductive wire 12 results from a conductor pattern formed on the green sheet by means of printing, etc. The reverse pattern portion 11 is present around the internal conductive wire 12 in the internal conductive wire-forming layer 10. The reverse pattern portion 11 is made of soft magnetic alloy grains 15 and, together with the internal conductive wires 12, constitutes the internal conductive wire-forming layer 10. The reverse pattern portion 11 should preferably have a thickness roughly the same as the thickness of the internal conductive wire 12, but the thickness of the reverse pattern portion 11 may be different from the thickness of the internal conductive wire 12. The laminated inductor 1 can have an area produced by heat-treating a dummy sheet containing soft magnetic alloy grains, at the top and/or bottom of the laminate structure formed by internal conductive wire-forming layers 10 and magnetic layers 20.

The laminated inductor 1 has a structure whereby a majority of the internal conductive wires 12 are embedded in a magnetic material. The magnetic material is constituted by magnetic layers 20 laminated by sandwiching in between each pair an internal conductive wire-forming layer 10 in which internal conductive wires 12 are present, as well as by reverse pattern portions 11 positioned in the internal conductive wire-forming layers 10. Typically, the internal conductive wires 12 are coils formed in a helical pattern, and in this case a conductor pattern having a near perfect circle, semicircle, etc., can be printed on a green sheet by means of screen printing, etc., and through holes are filled with a conductor, and then many of these sheets can be laminated on top of one another. The green sheet on which a conductor pattern is printed contains a magnetic material and has through holes provided at specified positions. Note that the internal conductive wire may be, in addition to the helical coil as shown, a spiral coil, meandering conductive wire, or straight conductive wire, or the like.

FIG. 1(*b*) is a schematic enlarged view showing areas near the boundary of the reverse pattern portion 11 and magnetic layer 20 in the internal conductive wire-forming layer 10. In the laminated inductor 1, many soft magnetic alloy grains 15 are packed to constitute the reverse pattern portion 11 of a specified shape. Similarly, many soft magnetic alloy grains 25 are packed to constitute the magnetic layer 20 of a specified shape. An oxide film is formed to cover almost all areas around the individual soft magnetic alloy grains 15, 25, and this oxide film ensures the insulation property of the reverse pattern portion 11 and magnetic layer 20. Preferably this oxide film should be produced by oxidization of the surface of soft magnetic alloy grains 15, 25 and their vicinity. In the drawing, the oxide film is not illustrated. Adjacent soft magnetic alloy grains 15, 25 constitute a reverse pattern portion 11 and magnetic layer 20 of a specified shape, respectively, generally as a result of the oxide films of the soft magnetic alloy grains 15, 25 bonding with each other. The metal parts of adjacent soft magnetic alloy grains 15, 25 may partially bond with each other. Also near the internal conductive wire 12, soft magnetic alloy grains 15, 25 are adhered to the internal conductive wire 12 primarily via the oxide film. It has been confirmed that, if the soft magnetic alloy grains 15, 25 are made of a Fe—M—Si alloy (where M represents a metal that is oxidized more easily than iron), the oxide film contains at least $Fe_3O_4$ which is a magnetic body, and $Fe_2O_3$ and MOx (where x represents a value determined according to the oxidation number of metal M) which are non-magnetic bodies.

Presence of the aforementioned oxide film bonds can be clearly identified by, for example, taking a SEM observation image of approx. 3000 magnifications and visually confirming that the oxide films formed on adjacent soft magnetic alloy grains 15, 25 have the same phase. Presence of oxide film bonds improves the mechanical strength and insulation property of the laminated inductor 1. Although preferably the oxide films formed on adjacent soft magnetic alloy grains 15, 25 should be bonded together over the entire laminated inductor 1, improvement in mechanical strength and insulation property can be achieved correspondingly as long as these bonds are formed at least partially, and therefore this pattern characterized by partial presence of oxide film bonds is considered an embodiment of the present invention.

Similarly, as for the aforementioned bonding of metal parts of soft magnetic alloy grains 15, 25 (metal bond), presence of metal bonds can also be clearly identified by, for example, taking a SEM observation image of approx. 3000 magnifications and visually confirming that adjacent soft magnetic alloy grains 15, 25 have the same phase and also a point of union. Presence of metal bonds between adjacent soft magnetic alloy grains 15, 25 improves the magnetic permeability further.

It should be noted that a pattern where adjacent soft magnetic alloy grains are simply making physical contact or positioned near each other without forming any oxide film bond or metal bond can exist locally.

For the conductor constituting the internal conductive wire 12 in the internal conductive wire-forming layer 10 of the laminated inductor 1, any metal normally used for conductive wires of laminated inductors can be used as deemed appropriate, including, but not limited to, silver, silver alloy, etc., for example. Typically both ends of the internal conductive wire 12 are led out, via a lead conductor (not illustrated), respectively, to the opposing end faces on the exterior surface of the laminated inductor 1, and then connected to external terminals (not illustrated).

According to the present invention, the average grain size of the soft magnetic alloy grains 15 used for the reverse pattern portion 11 is greater than the average grain size of the soft magnetic alloy grains 25 used for the magnetic layer 20. Also, preferably the soft magnetic alloy grains 25 used for the magnetic layer 20 should have the same or a similar composition as the soft magnetic alloy grains 15 used for the reverse pattern portion 11, and specifically the types of constituent elements of soft magnetic alloy grains should be the same between the magnetic layer 20 and reverse pattern portion 11, and more preferably the types and abundance ratios of constituent elements of soft magnetic alloy grains should be the same between the magnetic layer 20 and reverse pattern portion 11.

It is acceptable the types of constituent elements of soft magnetic alloy grains are the same between the magnetic layer 20 and reverse pattern portion 11, but the abundance ratios of constituent elements of soft magnetic alloy grains are different between the magnetic layer 20 and reverse pattern portion 11. Sameness of the types of constituent elements is explained by the following example. Specifically, if there are two types of soft magnetic alloys (Fe—Cr—Si soft magnetic alloys), each constituted by three elements of Fe, Cr and Si, the types of constituent elements are considered the same between these alloys regardless of the abundance ratios of Fe, Cr and Si.

The average grain size of the soft magnetic alloy grains 15 used for the reverse pattern portion 11 should be preferably at least 1.3 times, or more preferably in a range of 1.5 to 7.0 times, the average grain size of the soft magnetic alloy grains 25 used for the magnetic layer 20.

Based on the aforementioned constitution, the reverse pattern portion 11 is constituted by large soft magnetic alloy grains 15 and consequently the magnetic permeability improves. According to the present invention, the magnetic layer 20 that contacts internal conductive wires 12 over a large area can use small soft magnetic alloy grains. This way, the internal conductive wires 12 do not break easily even when the conductive wires become thinner as the device becomes smaller. As a result, size reduction and magnetic permeability improvement of the device can be achieved at the same time. In particular, good bonding property can be ensured between the magnetic layer 20 and reverse pattern portion 11 as long as the magnetic layer 20 and reverse pattern portion 11 are constituted by soft magnetic alloy grains having the same or a similar composition. While the interface between the reverse pattern portion 11 and magnetic layer 20 is depicted as a clear separation of materials in FIG. 1(*a*), in reality, as shown in the partially enlarged view in FIG. 1(*b*), the soft magnetic alloy grains 15 used for the reverse pattern portion 11 and soft magnetic alloy grains 25 used for the magnetic layer 20 may be mixed near the bonding interface.

The average grain size of the soft magnetic alloy grains 15, 25 used for the magnetic layer 20 and reverse pattern portion 11 is indicated by the d50 value which is obtained by taking a SEM image and analyzing the image. To be specific, a SEM image (approx. 3000 magnifications) of a section cutting across the magnetic layer 20 and reverse pattern portion 11 is taken and at least 300 average-sized grains are selected from the measurement location, and then the area of these grains is measured on the SEM image to calculate the average grain size by assuming that the grains are spherical. Examples of how grains are selected are given below. If fewer than 300 grains are found in the SEM image, all grains in the SEM image are sampled and this process is repeated in multiple locations to select at least 300 grains. If more than 300 grains are found in the SEM image, straight lines are drawn over the SEM image at a specified pitch and all grains on these straight lines are sampled to select at least 300 grains. Alternatively, two parallel lines are drawn along an internal conductive wire at a pitch equivalent to the thickness of the internal conductive wire, and grains present between these parallel lines are sampled as grains in the reverse pattern portion, while grains present outside the parallel lines are sampled as grains in the magnetic layer. In this case, too, sampling should be performed in multiple locations if fewer than 300 grains are found in each location. Note that, with a laminated inductor using soft magnetic alloy grains, the grain sizes of the material grains are known to be roughly the same as the grain sizes of the soft magnetic alloy grains 15, 25 constituting the magnetic layer 20 and reverse pattern portion 11 after heat treatment. Accordingly, it is possible to assume the average grain size of the soft magnetic alloy grains contained in the laminated inductor 1 by measuring the average grain size of the soft magnetic alloys used for the material.

A typical method of manufacturing a laminated inductor 1 conforming to the present invention is explained below. To manufacture the laminated inductor 1, first a doctor blade, die-coater or other coating machine is used to coat a prepared magnetic paste (slurry) onto the surface of a base film made of resin, etc. The coated film is then dried using a hot-air dryer or other dryer to obtain a green sheet. The green sheet thus obtained will become the magnetic layer 20 in the completed laminated inductor 1. The magnetic paste contains soft magnetic alloy grains and, typically, a polymer resin as a binder, and solvent.

The soft magnetic alloy grain is primarily made of an alloy and exhibits soft magnetism. An example of the type of this alloy is Fe—M—Si alloy (where M represents a metal that is oxidized more easily than iron). M may be Cr, Al, etc., and should preferably be Cr. The soft magnetic alloy grain may be manufactured by the atomization method, for example.

If M is Cr, or specifically in the case of a Fe—Cr—Si alloy, the chromium content should preferably be 2 to 8 percent by weight. Presence of chromium is preferred because it creates a passive state when heat-treated to suppress excessive oxidation, while demonstrating strength and insulation resistance. On the other hand, however, preferably the amount of chromium should be kept as small as possible from the viewpoint of improving magnetic characteristics. The aforementioned favorable range is proposed in consideration of these characteristics.

The Si content in a Fe—Cr—Si soft magnetic alloy should preferably be 1.5 to 7 percent by weight. Higher content of Si is preferable because it increases resistance and magnetic permeability, while lower content of Si is associated with good formability. The aforementioned favorable range is proposed in consideration of these characteristics.

The remainder of a Fe—Cr—Si alloy other than Si and Cr should preferably be iron, except for unavoidable impurities. Metals that may be contained in the alloy, other than Fe, Si and Cr, include aluminum, magnesium, calcium, titanium, manganese, cobalt, nickel and copper, and the like. Non-metals that may be contained include phosphorous, sulfur and carbon, and the like.

The chemical composition of the alloy constituting each soft magnetic alloy grain in the laminated inductor 1 can be calculated by, for example, capturing a section of the laminated inductor 1 using a scanning electron microscope (SEM) and then applying the ZAF method based on energy dispersive X-ray spectroscopy (EDS).

According to the present invention, preferably the magnetic paste (slurry) for the magnetic layer 20 should be manufactured separately from the magnetic paste (slurry) for the reverse pattern portion 11. Relatively small soft magnetic alloy grains are used to manufacture the magnetic paste (slurry) for the magnetic layer 20, while soft magnetic alloy grains larger than the aforementioned grains are used to manufacture the magnetic paste (slurry) for the reverse pattern portion 11.

As for the grain size of the soft magnetic alloy grain used as the material for the magnetic layer 20, the d50 by volume standard should be preferably 2 to 20 μm, or more preferably 3 to 10 μm. As for the grain size of the soft magnetic alloy grain used as the material for the reverse pattern portion 11, the d50 by volume standard should be preferably 5 to 30 μm, or more preferably 6 to 20 μm. The d50 of the material soft magnetic alloy grain is measured using a grain size/granularity distribution measurement apparatus based on the laser diffraction scattering method (such as Microtrack by Nikkiso). With a laminated inductor using soft magnetic alloy grains, the grain sizes of soft magnetic alloy grains 15, 25 contained in the completed laminated inductor 1 are known to be roughly the same as the grain size of the material soft magnetic alloy grain.

Preferably the aforementioned magnetic paste should contain a polymer resin as a binder. The type of this polymer resin is not limited in any way, and examples include polyvinyl butyral (PVB) and other polyvinyl acetal resins, and the like. The type of solvent for the magnetic paste is not limited in any way, and examples include butyl carbitol and other glycol ether, and the like. The blending ratio of soft magnetic alloy grains, polymer resin, solvent, etc., and other conditions of the magnetic paste can be adjusted as deemed appropriate, and the viscosity and other properties of the magnetic paste can be set through such adjustments.

Figure 2:
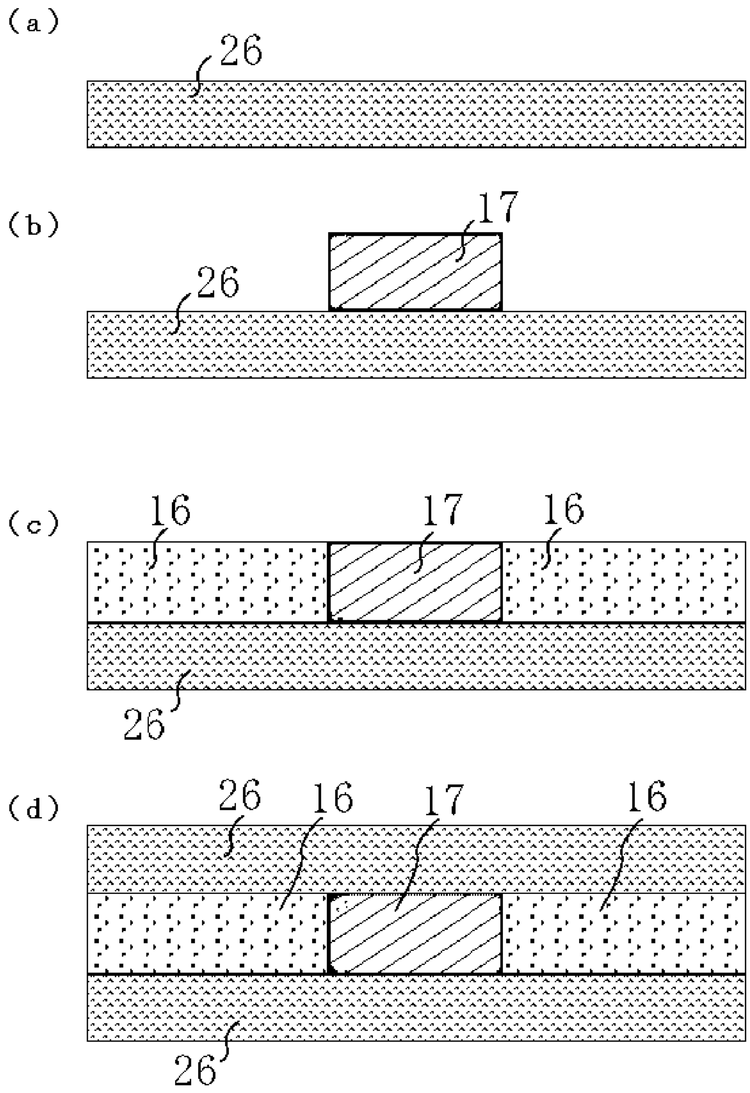
FIG. 2 is a schematic section view showing an example of how a laminated inductor is manufactured.

For the specific method to coat and dry the magnetic paste to obtain a green sheet, any conventional technology can be applied as deemed appropriate. FIG. 2 is a schematic section view showing one example of how a laminated inductor is manufactured. FIG. 2(*a*) shows a green sheet 26 obtained as described above.

Next, a stamping machine, laser processing machine or other punch machine is used to punch the green sheet 26 to form through holes (not illustrated) in a specified layout. The layout of through holes is set in such a way that, when the sheets are laminated on top of one another, the conductor-filled through holes and conductor pattern will form internal conductive wires. For the layout of through holes and shape of conductor pattern used to form internal conductive wires, any conventional technology can be applied as deemed appropriate. In the example section later, a specific example is explained by referring to the drawings.

Preferably a conductive paste should be used to fill the through holes and also to print the conductor pattern. The conductive paste contains conductive grains and, typically, a polymer resin as a binder, and solvent.

For the conductive grains, silver grains or the like may be used. As for the grain size of the conductive grain, the d50 by volume standard should preferably be 1 to 10 μm. The d50 of the conductive grain is measured using a grain size/granularity distribution measurement apparatus based on the laser diffraction scattering method (such as Microtrack by Nikkiso).

Preferably the conductive paste should contain a polymer resin as a binder. The type of this polymer resin is not limited in any way, and examples include polyvinyl butyral (PVB) and other polyvinyl acetal resins, and the like. The type of solvent for the conductive paste is not limited in any way, and examples include butyl carbitol and other glycol ether, and the like. The blending ratio of soft magnetic alloy grains, polymer resin, solvent, etc., and other conditions of the conductive paste can be adjusted as deemed appropriate, and the viscosity and other properties of the conductive paste can be set through such adjustments.

Next, as shown in FIG. 2(*b*) a screen printer, gravure printer or other printer is used to print the conductive paste onto the surface of the green sheet 26 and then the printed sheet is dried using a hot-air dryer or other dryer to form a conductor pattern 17 corresponding to the internal conductive wires. During the printing process, part of the conductive paste is also filled in the through holes.

The aforementioned magnetic paste (slurry) for the reverse pattern portion 11 is applied by means of screen printing, etc., around the conductor pattern 17 on the surface of the green sheet 26, and then the coated sheet is heated and dried to form reverse pattern precursor areas 16 (refer to FIG. 2(*c*)). At this time, preferably the height of the conductor pattern 17 should be roughly aligned with the height of the reverse pattern precursor area 16.

Furthermore, a green sheet 26 is formed on top of the conductor pattern 17 and reverse pattern precursor areas 16 (refer to FIG. 2(*d*)), and this process is repeated to obtain a laminate before heating.

It should be noted that it is possible to prepare the necessary number of green sheets 26, each having a conductor pattern 17 and reverse pattern precursor area 16 formed on it as shown in FIG. 2(*c*), and stack these sheets on top of one another to obtain a laminate before heating, without going through the step illustrated in FIG. 2(*d*).

The laminate-before-heating, obtained as above, should preferably be produced by pressure-bonding under heat. Next, a dicing machine, laser processing machine or other cutting machine is used to cut the laminate to the size of the component body to produce a before-heat-treatment chip.

A sintering furnace or other heating apparatus is used to heat-treat the before-heat-treatment chip in standard atmosphere or other oxidizing atmosphere. This heat treatment normally includes the binder removal process and oxide film-forming process, where the binder removal process is implemented under conditions sufficient to remove the polymer resin used as the binder, such as approx. 300° C. for approximately 1 hour, while the oxide film-forming process is implemented under the conditions of approx. 750° C. for approximately 2 hours, for example.

The before-heat-treatment chip has many fine gaps between individual soft magnetic alloy grains and these fine gaps are normally filled with a mixture of solvent and binder. These fillings are removed in the binder removal process, so by the time the binder removal process is complete, the fine gaps have turned into pores. The before-heat-treatment chip also has many fine gaps between conductive grains. These fine gaps are filled with a mixture of solvent and binder. These fillings are also removed in the binder removal process.

The oxide film-forming process that follows the binder removal process causes the soft magnetic alloy grains 15, 25 to become densely packed to form magnetic layers 20 and reverse pattern portions 11, and when this happens, typically the surfaces of individual soft magnetic alloy grains 15, 25 and their vicinity oxidize and an oxide film is formed on the surfaces of soft magnetic alloy grains 15, 25. At the same time, the conductive grains are sintered to form internal conductive wires 12. This way, a laminate structure of the laminated inductor 1 is obtained.

Normally external terminals are formed after heat treatment. A dip coater, roller coater or other coating machine is used to coat the prepared conductive paste on both lengthwise ends of the laminated inductor 1, after which the coated inductor is baked using a sintering furnace or other heating apparatus under the conditions of approx. 600° C. for approximately 1 hour, for example, to form external terminals. For the conductive paste for the external terminals, the aforementioned paste for printing a conductor pattern or any similar paste can be used as deemed appropriate.

Example

The present invention is explained more specifically below using examples. Note, however, that the present invention is not at all limited to the embodiments described in these examples.

[Specific Structure of Laminated Inductor]

An example of the specific structure of the laminated inductor 1 manufactured in this example is explained. As a component, the laminated inductor 1 has a length of approx. 3.2 mm, width of approx. 1.6 mm and height of approx. 1.0 mm, and has a rectangular solid shape as a whole.

Figure 3:
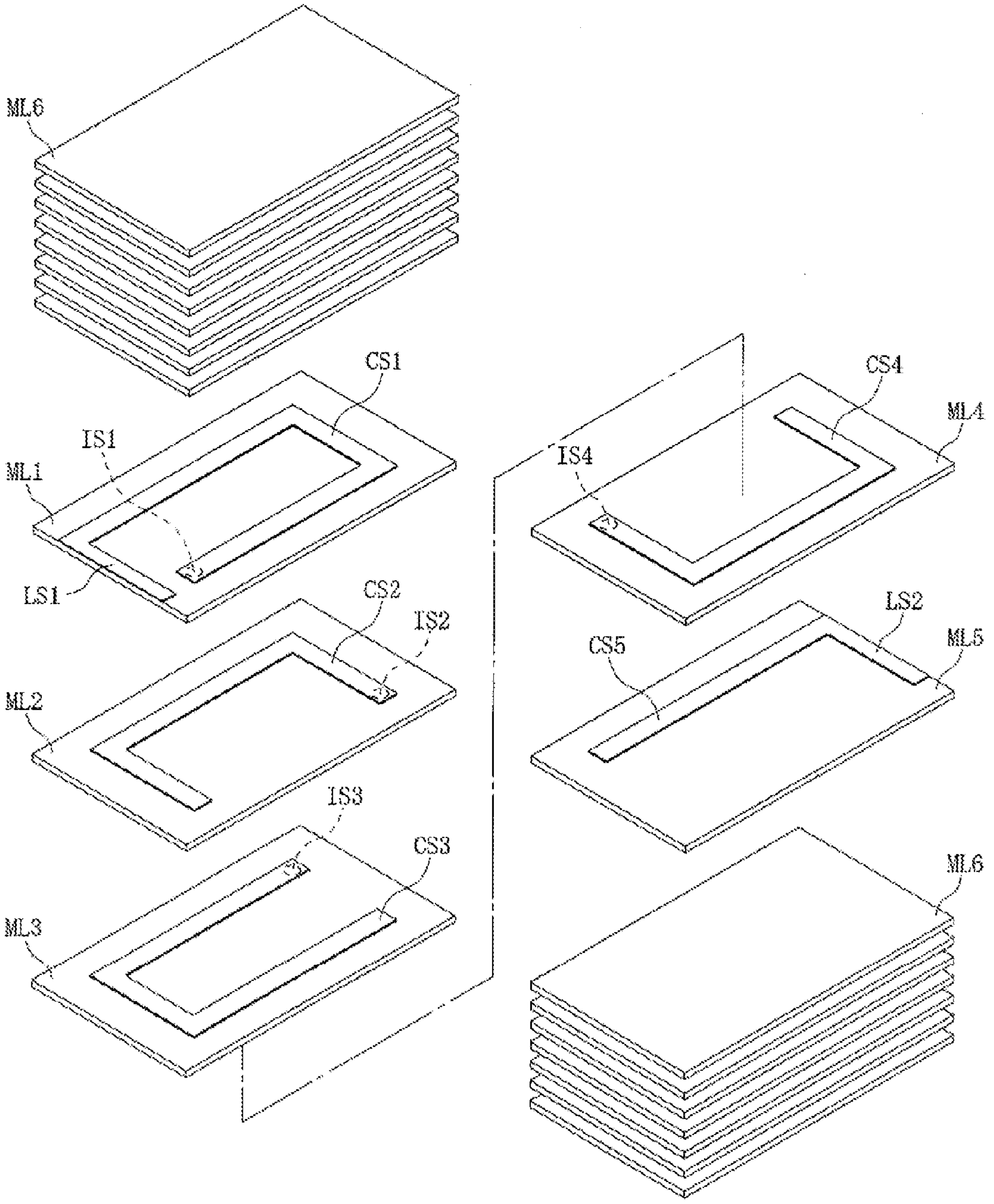
FIG. 3 is a schematic exploded view of a laminated inductor.

FIG. 3 is a schematic exploded view of the laminated inductor. Note that reverse pattern portions 11 that would have been formed around the internal conductive wires are not shown to simplify the drawing. The laminated inductor has a laminate structure of internal conductive wire forming layers 10 and magnetic layers 20, constituted by integrating a total of five magnetic layers ML1 to ML5 having internal conductive wires 12 and reverse pattern portions 11. The aforementioned laminate structure has dummy sheets on top and bottom, where the dummy sheets on top are structured by eight layers of magnetic layer ML6 integrated together, while the dummy sheets at the bottom are structured by seven layers of magnetic layer ML6 integrated together. The laminated inductor 1 has a length of approx. 3.2 mm, width of approx. 1.6 mm and height of approx. 1.0 mm. Each of the magnetic layers ML1 to ML6 has a length of approx. 3.2 mm, width of approx. 1.6 mm and thickness of approx. 30 μm. The magnetic layers ML1 to ML6 and reverse pattern portions (not illustrated) are primarily formed by soft magnetic alloy grains having the compositions and average grain sizes (d50) shown in Table 1 and contain no glass. Also, the inventors of the present invention confirmed, by means of SEM observation (3000 magnifications), that an oxide film (not illustrated) was present on the surface of each soft magnetic alloy grain, and among the soft magnetic alloy grains 15, 25 constituting the magnetic layer 20 and reverse pattern portion 11, adjacent alloy grains were bonded together via their respective oxide films.

The internal conductive wires 12 have a coil structure characterized by a total of five coil segments CS1 to CS5 helically integrated with a total of four relay segments IS1 to IS4 connecting the coil segments CS1 to CS5, where the number of windings is approx. 3.5. These internal conductive wires 12 are obtained primarily by heat-treating silver grains, and the d50 by volume standard of the material silver grain is 5 μm.

The four coil segments CS1 to CS4 have a C shape, while the one coil segment CS5 has a strip shape, and each of the coil segments CS1 to CS5 has a thickness of approx. 20 μm and width of approx. 0.2 mm. The top coil segment CS1 has an L-shaped leader part LS1 formed continuously from the segment for use in connecting to an external terminal, while the bottom coil segment CS5 has an L-shaped leader part LS2 formed continuously from the segment for use in connecting to an external terminal. The relay segments IS1 to IS4 are shaped as columns that pass through the magnetic layers ML1 to ML4, respectively, and each segment has a bore of approx. 15 μm.

Each external terminal (not illustrated) covers each end face in the lengthwise direction, and four side faces near the end face, of the laminated inductor 1, and its thickness is approx. 20 μm. One external terminal connects to the edge of the leader part LS1 on the top coil segment CS1, while the other external terminal connects to the edge of the leader part LS2 on the bottom coil segment CS5. These external terminals were obtained primarily by heat-treating silver grains whose d50 by volume standard was 5 μm.

[Manufacturing of Laminated Inductor]

A magnetic paste constituted by 85 percent by weight of soft magnetic alloy grains, 13 percent by weight of butyl carbitol (solvent) and 2 percent by weight of polyvinyl butyral (binder), as shown in Table 1, was prepared. A magnetic paste for the magnetic layer 10 was prepared separately from a magnetic paste for the reverse pattern portion 11. A doctor blade was used to coat the magnetic paste for the magnetic layer 10 onto the surface of a base film made of plastic, and the coated film was dried with a hot-air dryer under the conditions of approx. 80° C. for approximately 5 minutes. This way, a green sheet was produced on the base film. Next, the green sheet was cut to obtain first through sixth sheets corresponding to the magnetic layers ML1 to ML6 (refer to FIG. 3), respectively, and also having a size appropriate for forming multiple cavities.

Next, the first sheet corresponding to the magnetic layer ML1 was punched using a punch machine to form through holes in a specified layout corresponding to the relay segment IS1. Similarly, through holes corresponding to the relay segments IS2 to IS4 were formed in specified layouts in the second through fourth sheets corresponding to the magnetic layers ML2 to ML4, respectively.

Next, a printer was used to print onto the surface of the first sheet the conductive paste constituted by 85 percent by weight of silver grains, 13 percent by weight of butyl carbitol (solvent) and 2 percent by weight of polyvinyl butyral (binder), and then the coated sheet was dried with a hot-air dryer under the conditions of approx. 80° C. for approximately 5 minutes, to produce a first conductor pattern corresponding to the coil segment CS1 in a specified layout. Similarly, second through fifth conductor patterns corresponding to the coil segments CS2 to CS5 were produced in specified layouts on the surfaces of the second through fifth sheets, respectively.

Next, the magnetic paste for the reverse pattern portion 11 was printed onto the surfaces of the first through fifth sheets, except for the coil segments CS1 to CS5, using the screen printing method. The printed sheets were dried with a hot-air dryer under the conditions of approx. 80° C. for approximately 5 minutes, to form reverse pattern precursor areas.

Since the through holes formed in the first through fourth sheets were present in positions overlapping with the ends of the first through fourth conductor patterns, the conductive paste was partially filled into the through holes when the first through fourth conductor patterns were printed, and first through fourth filled areas corresponding to the relay segments IS1 to IS4 were formed.

Next, a suction transfer machine and press machine were used to stack, on top of one another in the order shown in FIG. 3, the first through fourth sheets on which conductor patterns, filled areas and reverse pattern precursor areas had been provided, the fifth sheet on which a conductor pattern and reverse pattern precursor areas had been provided, and the sixth sheet on which no conductor pattern or filled areas had been provided, and then to pressure-bond the stacked sheets under heat, to produce a laminate. This laminate was cut to the size of the component body using a cutting machine, to obtain a before-heat-treatment chip.

Next, a sintering furnace was used to heat-treat many before-heat-treatment chips, all at once, in a standard atmosphere. First, the chips were heated under the conditions of approx. 300° C. for approximately 1 hour as the binder removal process, after which they were heated under the conditions of approx. 750° C. for approximately 2 hours as the oxide film-forming process. The above heat treatments caused the soft magnetic alloy grains to become densely packed to form magnetic layers 20 and reverse pattern portions 11, while the silver grains were sintered to form internal conductive wires 12, and consequently a component body was obtained.

Next, external terminals were formed. The conductive paste constituted by 85 percent by weight of silver grains, 13 percent by weight of butyl carbitol (solvent) and 2 percent by weight of polyvinyl butyral (binder) was applied to both lengthwise ends of the component body using a coater, and the component body was baked in a sintering furnace under the conditions of approx. 800° C. for approximately 1 hour. As a result, the solvent and binder were removed, silver grains were sintered, external terminals were formed, and a laminated inductor 1 was obtained.

[Evaluations of Laminated Inductor]

The obtained laminated inductor was evaluated for bonding property between the magnetic layer 20 and reverse pattern portion 11. The evaluation method is described below.

Evaluation was made by observing a side face of the chip, or fractured surface or polished surface of the chip, using an optical microscope at 100 magnifications.

The guideline for this evaluation is as follows:

○—There is no visible peeling, cracking, etc.

x—There is visible peeling, cracking, etc.

The obtained laminated inductor was measured for inductance at 1 MHz using the Impedance Analyzer 4294A by Agilent Technologies. For comparison, a laminated inductor was produced by forming reverse pattern portions 11 using identical soft magnetic alloy grains used for magnetic layers 20 (hereinafter referred to as "inductor for comparison"), and the inductance of the target laminated inductor was compared with the that of the inductor for comparison.

The guideline for this evaluation is as follows:

○—Inductance is higher than that of the inductor for comparison.

x—Inductance is equal to or lower than that of the inductor for comparison.

The obtained laminated inductor was evaluated for continuity of internal conductive wires 12. The evaluation method is described below.

The resistance between external terminals of 500 laminated inductors was measured using Yokogawa 7552 Digital Multimeter to evaluate whether wire breakage occurred or not. The wire was deemed broken when the resistance between external terminals was 1Ω or more.

The guideline for this evaluation is as follows:

○—Wire breakage occurred on less than 1% of inductors or did not occur.

x—Wire breakage occurred on 1% or more of inductors.

The above results were compiled to determine an overall evaluation of the laminated inductor based on the following standard:

○—All of the above three evaluations produced ○.

x—At least one of the above three evaluations produced x.

The manufacturing conditions and evaluation results of examples and comparative examples are summarized in Table 1. Comparative examples of the present invention are denoted by "*" after the sample number. Samples 1, 5 and 9 are "inductors for comparison" as specified above.

TABLE 1

| | Composition of magnetic layer [wt %] | Grain size in magnetic layer [μm] | Composition of reverse pattern portion [wt %] | Grain size in reverse pattern portion [μm] | Bonding | L value | Continuity | Judgment |
|---|---|---|---|---|---|---|---|---|
| 1* | Cr: 4.5, Si: 3.5 | 3.0 | Cr: 4.5, Si: 3.5 | 3.0 | ○ | X | ○ | X |
| 2 | Cr: 4.5, Si: 3.5 | 3.0 | Cr: 4.5, Si: 3.5 | 6.0 | ○ | ○ | ○ | ○ |
| 3 | Cr: 4.5, Si: 3.5 | 3.0 | Cr: 4.5, Si: 3.5 | 20.0 | ○ | ○ | ○ | ○ |
| 4* | Cr: 4.5, Si: 3.5 | 6.0 | Cr: 4.5, Si: 3.5 | 3.0 | ○ | X | ○ | X |
| 5* | Cr: 4.5, Si: 3.5 | 6.0 | Cr: 4.5, Si: 3.5 | 6.0 | ○ | X | ○ | X |
| 6 | Cr: 4.5, Si: 3.5 | 6.0 | Cr: 4.5, Si: 3.5 | 20.0 | ○ | ○ | ○ | ○ |
| 7* | Cr: 4.5, Si: 3.5 | 20.0 | Cr: 4.5, Si: 3.5 | 3.0 | ○ | X | X | X |
| 8* | Cr: 4.5, Si: 3.5 | 20.0 | Cr: 4.5, Si: 3.5 | 6.0 | ○ | X | X | X |
| 9* | Cr: 4.5, Si: 3.5 | 20.0 | Cr: 4.5, Si: 3.5 | 20.0 | ○ | X | X | X |
| 10 | Cr: 4.5, Si: 7.0 | 3.0 | Cr: 4.5, Si: 7.0 | 20.0 | ○ | ○ | ○ | ○ |
| 11 | Cr: 4.5, Si: 7.0 | 6.0 | Cr: 4.5, Si: 7.0 | 20.0 | ○ | ○ | ○ | ○ |
| 12 | Cr: 4.5, Si: 1.5 | 3.0 | Cr: 4.5, Si: 1.5 | 20.0 | ○ | ○ | ○ | ○ |
| 13 | Cr: 4.5, Si: 1.5 | 6.0 | Cr: 4.5, Si: 1.5 | 20.0 | ○ | ○ | ○ | ○ |
| 14 | Cr: 8.0, Si: 3.5 | 3.0 | Cr: 8.0, Si: 3.5 | 20.0 | ○ | ○ | ○ | ○ |
| 15 | Cr: 8.0, Si: 3.5 | 6.0 | Cr: 8.0, Si: 3.5 | 20.0 | ○ | ○ | ○ | ○ |
| 16 | Al: 5.5, Si: 9.5 | 6.0 | Al: 5.5, Si: 9.5 | 20.0 | ○ | ○ | ○ | ○ |
| 17* | Cr: 4.5, Si: 3.5 | 6.0 | Al: 5.5, Si: 9.5 | 6.0 | X | X | ○ | X |
| 18* | Cr: 4.5, Si: 3.5 | 6.0 | Al: 5.5, Si: 9.5 | 20.0 | X | ○ | ○ | X |
| 19 | Cr: 4.5, Si: 3.5 | 3.0 | Cr: 8.0, Si: 3.5 | 20.0 | ○ | ○ | ○ | ○ |
| 20 | Cr: 8.0, Si: 3.5 | 3.0 | Cr: 4.5, Si: 3.5 | 20.0 | ○ | ○ | ○ | ○ |
| 21 | Cr: 4.5, Si: 3.5 | 3.0 | Cr: 4.5, Si: 7.0 | 20.0 | ○ | ○ | ○ | ○ |

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. In this disclosure, any defined meanings do not necessarily exclude ordinary and customary meanings in some embodiments. Also, in this disclosure, "the invention" or "the present invention" refers to one or more of the embodiments or aspects explicitly, necessarily, or inherently disclosed herein.

The present application claims priority to Japanese Patent Application No. 2011-175382, filed Aug. 10, 2011, and No. 2011-284576, filed Dec. 26, 2011, each disclosure of which is incorporated herein by reference in its entirety. In some embodiments, as the soft magnetic alloy grains, for example, those disclosed in U.S. Patent Application Publication No. 2011/0267167 A1 and No. 2012/0038449, and co-assigned U.S. patent application Ser. No. 13/313,982 can be used, each disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A laminated inductor having a laminate structure comprised of a magnetic layer and an internal conductive wire-forming layer, wherein the magnetic layer is formed by soft magnetic alloy grains adjacent to each other, the internal conductive wire-forming layer comprises:

an internal conductive wire formed in a pattern on and in contact with the magnetic layer; and a reverse pattern portion formed in a pattern around and in contact with the internal conductive wire and on and in contact with the magnetic layer, said pattern of the reverse pattern portion being reverse to the pattern of the internal conductive wire, and the reverse pattern portion is formed by soft magnetic alloy grains adjacent to each other, whose constituent elements are substantially the same as those of, and whose average grain size is at least 1.3 times greater than that of, the soft magnetic alloy grains constituting the magnetic layer.

2. A laminated inductor according to claim 1, wherein the soft magnetic alloy grains forming the magnetic layer and those forming the reverse pattern portion are both made of a Fe—Cr—Si soft magnetic alloy.

3. A laminated inductor according to claim 1, wherein the average grain size of the soft magnetic alloy grains forming the reverse pattern portion is about 1.5 times to about 7.0 times the average grain size of the soft magnetic alloy grains forming the magnetic layer.

4. A laminated inductor according to claim 1, wherein the soft magnetic alloy grains forming the magnetic layer have a d50 by volume standard of about 2 μm to about 20 μm, and the soft magnetic alloy grains forming the reverse pattern portion have a d50 by volume standard of about 5 μm to about 30 μm.

5. A laminated inductor according to claim 1, wherein the soft magnetic alloy grains forming the reverse pattern portion have substantially the same compositions as the soft magnetic alloy grains forming the magnetic layer.

6. A laminated inductor according to claim 1, wherein the soft magnetic alloy grains forming the magnetic layer and the reverse pattern portion have oxide film formed on their surfaces.

7. A laminated inductor according to claim 1, wherein the reverse pattern portion and the magnetic layer have the same thickness.

8. A laminated inductor according to claim 1, wherein the magnetic layer, the internal conductive wire, and the reverse pattern portion are heat-treated simultaneously.

9. A laminated inductor according to claim 1, wherein the laminate structure is comprised of a plurality of magnetic layers and a plurality of internal conductive wire-forming layers stacked alternately.

10. A laminated inductor according to claim 1, wherein the laminate structure further comprises a dummy layer containing soft magnetic alloy grains on a top and/or bottom of the laminate structure.

11. A laminated inductor according to claim 1, wherein the average grain size is measured using a SEM image of a cross section of the magnetic layer and the reverse pattern portion, showing a plurality of grains, wherein the average grain size of at least 300 adjacent grains found in a given region of the SEM image is measured.

* * * * *